United States Patent [19]
Rourke

[11] Patent Number: 5,619,138
[45] Date of Patent: Apr. 8, 1997

[54] METHOD OF PROVIDING AN RF PULSE FOR USE IN NMR

[75] Inventor: David E. Rourke, Winnipeg, Canada

[73] Assignee: National Research Council of Canada, Ottawa, Canada

[21] Appl. No.: 517,439

[22] Filed: Aug. 21, 1995

[51] Int. Cl.$^6$ ................................................. G01R 33/20
[52] U.S. Cl. ........................................ 324/309; 324/314
[58] Field of Search ................................. 324/300, 307, 324/309, 314, 318, 322

[56] References Cited

U.S. PATENT DOCUMENTS

| | | | |
|---|---|---|---|
| 4,450,408 | 5/1984 | Tieman | 324/318 |
| 4,891,594 | 1/1990 | Wilfley et al. | 324/309 |
| 5,235,280 | 8/1993 | Deimling | 324/314 |
| 5,285,159 | 2/1994 | Bodenhausen et al. | 324/314 |
| 5,471,141 | 11/1995 | Yoshida et al. | 324/314 |

OTHER PUBLICATIONS

Kozlowski et al, "High Prefocused Selective Pulses—a tool for in vivo 31p Spectroscopic Imaging" 12th Ann. Meeting of SMRM (Aug. 1993).
Topp et al, "Late Self–Refocusing Frequency Selective RF Pulses" p. 1183 SMRM (1993).
Starcak, "Delayed Focus for Magnetic Resonance" p. 1179 SMRM (1993).
Wu et al, "Delayed Focus Pulses for MRI: An evolutionary Approach" Mag. Res. in Med. vol. 20 pp. 165–170 (1991).
Rourke et al, "Half solitons as solutions to the Zakharov–Shabat eigenvalue problem for rational reflection coefficient with application in the design of selective pulses in NMR" Phys. Rev. A vol. 46 No. 7, 1 Oct. 1992.

*Primary Examiner*—Sandra L. O'Shea
*Assistant Examiner*—Raymond Y. Mah
*Attorney, Agent, or Firm*—Neil Teitelbaum & Associates

[57] ABSTRACT

The invention relates to a method of determining prefocused pulses with sufficiently low power and short duration to allow multi-slice in-vivo spectroscopic imaging of humans. The method has two main stages, analytic and numerical. In the analytic stage a magnetization response is selected with certain desired characteristics such as prefocused time. During the numerical stage, the response is then transformed into an RF pulse for use in magnetic resonance imaging. The theoretical response to the RF pulse is evaluated and characteristics such as duration and amplitude may be altered to meet further requirements. The theoretical response is then transformed into an RF pulse for use in magnetic resonance imaging or for further application of the numerical stage.

18 Claims, 3 Drawing Sheets

METHOD OF PROVIDING AN RF PULSE FOR USE IN NMR

FIELD OF THE INVENTION

This invention relates generally to nuclear magnetic resonance (NMR). More specifically, it relates to a method of providing prefocused RF pulses to enable short echo-time spectroscopic imaging (SI) and magnetic resonance imaging (MRI) to be performed on phantoms, animals, and humans, and in single- and multi-slice modes.

BACKGROUND OF THE INVENTION

NMR is a technique whereby information describing an object can be obtained non-invasively. Magnetic resonance spectroscopy (MRS) provides information relating to the chemical composition of the whole object. MRI enables the density of nuclear spins to be determined at each point in an object. SI combines these techniques to provide information on the chemical composition in localized regions of the object. An example of its use is in determining the amounts of phosphorus metabolites in different regions of the human brain, allowing the diagnosis of various brain disorders.

Slichter, "Principles of Magnetic Resonance," Springer-Verlag, 1990, describes the physics underlying NMR. The use of NMR in spectroscopy is described by Saunders and Hunter, "Modern NMR Spectroscopy," Oxford University Press, 1988. Its use in imaging is described by Morris, "Nuclear Magnetic Resonance Imaging in Medicine and Biology," Clarendon Press, 1986. Brown et al., Proc. Natl. Acad. Sci. U.S.A., Vol. 79, pp. 3523–3526, 1982, describe spectroscopic imaging.

In brief, when an object contains nuclei that have non-zero spins, the nuclei are affected by magnetic fields. It is possible, by viewing the nuclei as spinning bar magnets, to treat the spin in a classical fashion. Placed in a uniform magnetic field directed along the z axis, whose direction is not aligned with the spin, of note will be three effects upon the axis of the spin's rotation. Firstly, the axis will itself rotate about the direction of the magnetic field, i.e., it will rotate in an x-y plane. That is, the spin precesses about the magnetic field. The angular velocity of the precession, $\omega$, is proportional to the strength of the magnetic field, B. Mathematically, the expression $\omega=\gamma B$ yields the angular velocity of the spin, where $\gamma$ is a constant for a given type of nucleus. Secondly, the rotation axis will decay towards the direction of the magnetic field—this is $T_1$ relaxation. Thirdly, the x-y component of the rotation axis decays to zero—this is $T_2$ relaxation. $T_2$ relaxation, in general, occurs more quickly than $T_1$ relaxation.

Generally, a series of steps are taken to obtain information about localized regions of an object using NMR. The sample is placed in a strong, uniform magnetic field $B_0$. Sufficient time is allotted such that the nuclear spins within the sample align with the field. An additional magnetic field, also along the z axis, is applied. The additional magnetic field is made to vary linearly in strength along some direction, which is assumed here for simplicity to also be the direction of the z axis. The field is known as a slice-select gradient. Hence, the extra magnetic field at a given z coordinate due to the gradient can be written $zG_z$ (for a suitable choice of the point $z=0$). When only the main and gradient fields are being applied, the nuclei precess about the z axis, with an angular velocity that is a function of z. This precession is called 'free-precession.'

A suitably chosen radio frequency (RF) electromagnetic pulse, or combination of such pulses, is then applied. This pulse has a magnetic field component varying at the RF frequency. Therefore, each spin sees an extra magnetic field component (only the projection onto the x-y plane being important), which causes its precession to be more complex than free-precession, since its angular speed varies in time, as does the axis about which the nucleus precesses. Mathematically, the effect of an RF pulse on the spins (or, equivalently, on the magnetization of the object) is given by the Bloch equation.

It is convenient to imagine observing the behavior of the spins not as a stationary observer, with the spins precessing rapidly about the instantaneous magnetic field, but as an observer rotating about the z axis at the same frequency as the RF pulse. This is known as the rotating frame. In the rotating frame, the spins behave as if the magnetic field in the z direction is $B_0+zG_z-\gamma\omega_{rf}$, where $\omega_{rf}$ is the angular frequency of the RF pulse. If $\omega_{rf}$ is chosen to equal $B_0$, then the above field is simply $zG_z$. This is the spin's "offset from resonance," often expressed in other units, such as angular frequency units (then offset from resonance equals $\gamma zG_z$).

The effect of the RF pulse is described in terms of the precession of the spins at each resonant offset value in the rotating frame. If the x and y axes are defined as some constant axes in the rotating frame, a pulse would be said, for example, to be a 90° pulse on a given spin if that spin's axis of rotation rotated about the x axis by 90°.

The RF pulse should be chosen so that the spins within a predetermined cross section or slice, which is in the x-y plane, are rotated by a given angle around an axis in the x-y plane, and that the spins outside the slice are unaffected. This is known as frequency-selective or slice-selective excitation. As described below, a signal can be picked up from this excited slice, the strength of which depends on the projection of the spins in the x-y plane. Hence frequency-selective pulses are most commonly designed to flip spins by 90°, since a spin initially in the z direction would be flipped by such a pulse into the x-y plane, producing the maximum signal.

This slice is then "encoded" by applying additional magnetic fields that vary linearly in directions perpendicular to the slice-select gradient, in this case, the x and y directions. These are labeled $G_x$ and $G_y$, and are called encoding gradients. If the object is placed within a coil, an electrical signal is induced in that coil by the spins within the excited and encoded slice, and not by the spins outside the slice. This signal, or free-induction decay (FID), gives chemical and spin-density information about the slice. In general, by repeating this procedure with different encoding gradients, it is possible to obtain chemical and spin-density information about localized volumes, or voxels, within the slice.

For example, to obtain spectroscopic imaging data of an object, both of the encoding gradients, called phase-encoding gradients in this application, are applied for a finite period after the end of the pulse. After the finite period, the FID is recorded. This is repeated several times, with each of the phase-encoding gradients stepping through a range of values. Typically, each gradient might be stepped through 8 values, and hence 64 FID acquisitions would be needed.

There is a significant problem with this procedure, related to the RF pulses that are used. For example, assuming that a 90° selective pulse has been used, ideally all the spins within the slice would be rotated by the pulse from the z axis to the same direction in the x-y plane, in which case they are said to be 'in phase.' In practice, RF pulses behave as if they are composed of an ideal pulse followed by a period of flee-precession; the selected spins all lie in the x-y plane, but they are dispersed throughout it. Given some fixed direction in the x-y plane, each spin lies at an angle from this direction that is linearly related to the magnetic field felt by the spin which is given by the main magnetic field, $B_0$, the spin's z coordinate, and the spin's chemical environment. This dispersion is known as a first order phase error.

The effect of the dispersion can be corrected by subsequent processing of the data, first order phase correction, which causes significant distortion of the data, typically in the baseline of the spectra. Another post-processing method for correcting this effect is ignoring the phase information in the spectra when calculating the magnitudes; this method leads to a loss in spectral resolution.

Alternatively, the phase error can be corrected by applying an additional pulse after the initial pulse, such additional pulse being designed to refocus the spins. Unfortunately, many compounds of interest, e.g., phosphorus metabolites, have a short $T_2$ time and, therefore, produce a signal that decays rapidly. The extra time needed for the additional pulse is often unacceptably long.

PRIOR ART

The class of prefocused pulses, first described by Ngo and Morris in J. Magn. Reson., Vol. 5, pp. 217–237, 1987, provides a means of performing short echo-time spectroscopic imaging. These pulses are frequency-selective; however, the spins come into phase automatically at some given time following the end of the pulse. This free-precession time following the pulse can be used to apply the phase-encoding gradient, and hence the signal can be acquired immediately afterwards. Since the spins are in phase at the point at which sampling of the FD is started, no first order phase correction is needed.

It would be advantageous to make RF pulses as short as possible and to minimize the required power of the RF pulses. This latter requirement is particularly important in spectroscopic imaging of humans, particularly when multi-slice imaging is required. Furthermore, the subsequent time needed for phase-encoding, and hence the time delay required for the spins to align after the end of the pulse, is often a significant fraction of the pulse time (typically the pulse is less than 4 ms, and the phase encoding 1 ms). Prefocused pulses where the free-precession time is a significant proportion of the pulse time are termed 'highly prefocused.'

Prefocused pulses have been designed previously. Ngo and Morris (see above) describe a numerical optimization technique, as did Wu et at. in Magn. Reson. Med., Vol. 20, pp. 165–170, 1991, Topp et al. in Abstracts of the Society of Magnetic Resonance in Medicine (SMRM), p. 1183, 1993, and Starcuk in Abstracts of SMRM, p. 1179, 1993.

Lim et al. in Magn. Reson. Med., Vol. 32, pp. 98–103, 1994 describe an analytic method of obtaining prefocused pulses; however, pulses obtained using the method have a fairly poor slice profile. Subtraction techniques are needed to make them acceptable.

Rourke et at. in Abstracts of SMRM, p. 1181, 1993, and Kozlowski et al. in J. Magn. Reson., Vol. 104, pp. 280–283, 1994, describe an analytic method of obtaining prefocused pulses with high power requirements which would not be suitable for multi-slice human imaging.

SUMMARY OF THE INVENTION

In an embodiment the invention seeks to provide a method of providing an RF pulse for use in MRI comprising the steps of: selecting a reflection coefficient related to a predetermined magnetization response; optimizing the reflection coefficient such that it yields a magnetization response within predetermined parameters; and providing a representation of an RF pulse based on the reflection coefficient.

In a further embodiment the invention seeks to provide a method of providing an RF pulse for use in MRI comprising the steps of: selecting a reflection coefficient related to a predetermined magnetization response; (a) determining a representation of an RF pulse related to the reflection coefficient; determining the magnetization response of the representation; when the magnetization response and the RF pulse are not within predetermined parameters optimizing the reflection coefficient and returning to step (a); and providing a final representation of an RF pulse based on the reflection coefficient.

In a further embodiment the invention seeks to provide a method of providing an RF pulse for use in MRI comprising the steps of: selecting a reflection coefficient related to $C_n$, a Chebyshev I filter response of order n, by the equation $r(\xi)=i/(1+\epsilon^2 C_n^2(\xi))$; (a) using the soliton lattice algorithm and the reflection coefficient to provide a representation of an RF pulse; determining the magnetization response of the representation; when the magnetization response and the RF pulse are not within predetermined parameters optimizing the reflection coefficient based on a predetermined cost function and returning to step (a); and providing a final representation of an RF pulse based on the reflection coefficient.

BRIEF DESCRIPTION OF THE DRAWINGS

Exemplary embodiments of the invention will now be described in conjunction with the following figures in which.

DETAILED DESCRIPTION OF THE INVENTION

Figure 1:
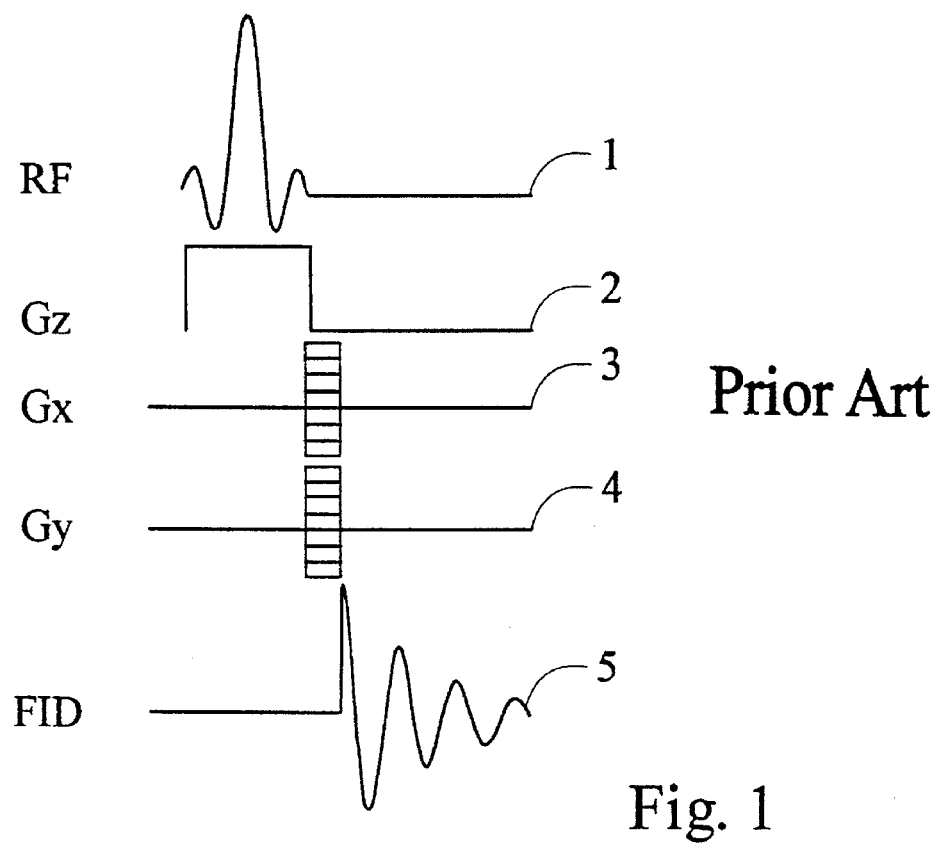
FIG. 1 is a timing diagram showing a prior art pulse sequence used to obtain spectroscopic imaging information.

Referring to FIG. 1, a commonly used pulse sequence used to obtain spectroscopic imaging information is shown. The RF pulse 1 is used, together with a slice-select gradient $G_z 2$ and phase-encoding gradients $G_x 3$ and $G_y 4$, remits in an FID 5 that requires subsequent first-order phase correction.

To obtain spectroscopic imaging data of an object, the encoding gradients 3 and 4, called phase-encoding gradients in this application, are both applied for a finite period of time after the end of the RF pulse 1. After this period, the FID 5 is recorded. Typically this is repeated several times, with the phase-encoding gradients 3 and 4 each being assigned a range of different values. Typically, each gradient might be assigned eight (8) values, and hence 64 FID acquisitions would be required. The fact that this experiment is repeated for different values of $G_x3$ and $G_y4$ is illustrated by the use of different $G_x3$ and $G_y4$ values stacked together. Subsequent to this procedure, computer processing of each FID 5 yields chemical information, such as spectra, at voxels throughout a slice.

Figure 2:
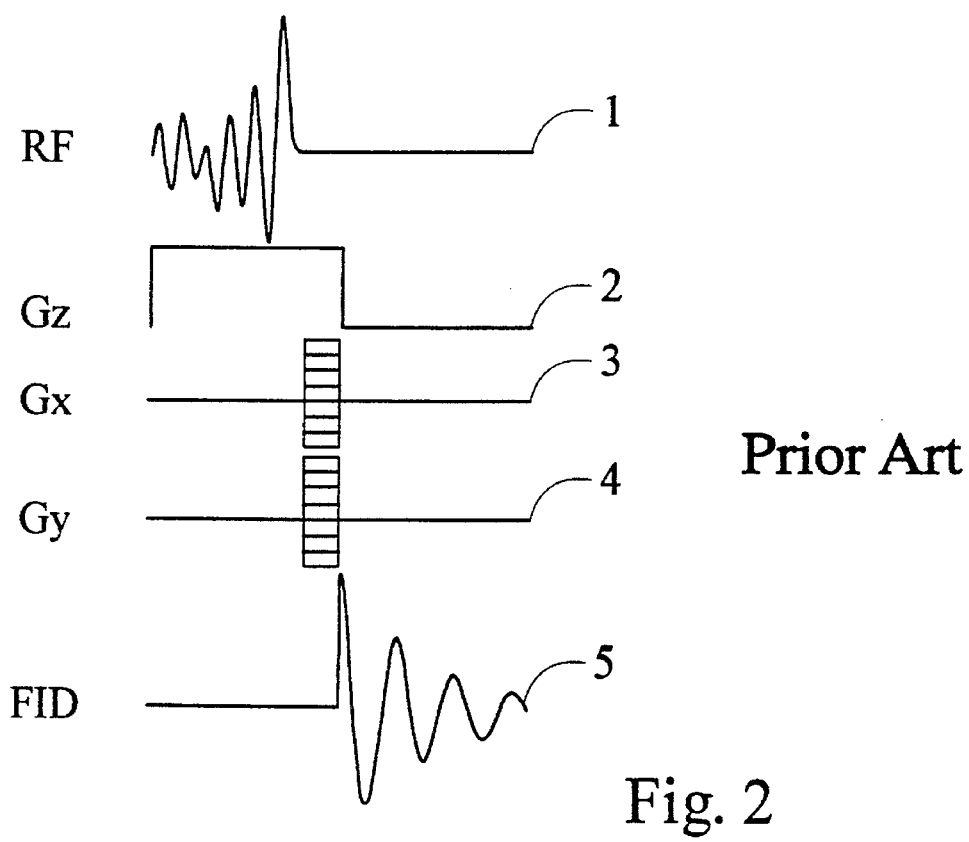
FIG. 2 is timing diagram showing a prior art pulse sequence to be used for application of a prefocused pulse in spectroscopic imaging.

The method according to this invention relates to prefocused pulses. FIG. 2 shows the timing required for a typical prefocused pulse. The slice-select gradient 2 must be acquired during both the pulse, and the subsequent period of free-precession—which must be long enough for the phase-encoding gradients 3 and 4 to be applied. The method of this invention is divided into two main stages. An RF pulse 1 is obtained via an analytic method and then, if required, the RF pulse 1 is improved using numerical optimization.

During the analytic stage an RF pulse I with a magnetization response within given tolerances is designed. In practice, the RF pulse 1 is finite having a negligible amplitude at a beginning and at an end. In the application of prefocused pulses, the RF pulse includes a period of predetermined duration and negligible amplitude at the end. FID 5 does not commence for the period after the end of the RF pulse 1; this period is referred to as the RF pulse's "prefocused time" and can be used to apply phase-encoding gradients 3 and 4. Further, during this stage, little consideration is given to the power or duration of the RF pulse 1; however, the prefocused time must have a duration equal to some predetermined specification, typically the time needed to apply encoding gradients 3 and 4.

When the resulting RF pulse 1 has excessive power or energy, it is refined using numerical optimization. A limit on the allowable pulse duration may require truncation of the RF pulse 1 designed during the analytic stage; alternatively the RF pulse 1 may be filtered so as to smoothly let the RF pulse's amplitude fall to zero. When the magnetization response of a truncated RF pulse is not satisfactory, the pulse is further optimized.

Analytic Stage pulses with any desired frequency response can be calculated, for example, with the soliton-lattice algorithm as described by Rourke et al. in Phys. Rev. A, Vol. 46, pp. 3631– 3636, and J. Math. Phys., Vol. 35, pp. 848–872. The desired behaviour of nuclear spins is given as a magnetization vector, $m=(m_1,m_2,m_3)$. This vector describes the final orientation of an axis about which the spins precess at the end of the pulse at some given resonance offset, $\omega_3$.

A pulse according to this invention ends at time t=0. Hence, the pulse is defined over the range $-\infty<t<0$, being a "semi-infinite" pulse. In practice, all pulses have a finite duration so there must be a time $T_0$ such that a representation, $\omega(t)$, of the RF pulse has negligible amplitude for $t<-T_0$.

For example, when m is the magnetization response to a pulse at t=0, a reflection coefficient" $r(\xi)$ may be defined as $$r(\xi)=(m_1+m_2)/(1+m_3)=(m)/(1+m_3),$$

where $M=m_1+i\, m_2$ and $\xi=(1/2)\omega_3 T$ is the dimensionless resonance offset-T being a constant with dimension time. i denotes the square root of $-1$.

In this example, when using the soliton-lattice algorithm, an exact calculation of $\omega(t)$, for any given $r(\xi)$, is possible when r can be expressed as a rational polynomial, i.e., in the form $$r(\xi) = K \frac{\prod_{j=1}^{n_z} (\xi - z_j)}{\prod_{j=1}^{n_p} (\xi - \rho_j)}$$

where $z_j$ and $p_j$ are the zeros and poles of $r(\xi)$, respectively. For semi-infinite pulses in this example, noting other than $r(\xi)$ need be specified to uniquely determine $\omega(t)$.

In this example, it is also necessary that the "soliton-lattice" data be derived in order to determine a representation $\omega(t)$ of the pulse based on $r(\xi)$. For the semi-infinite pulse of the example, the "soliton-lattice" data is a set of numbers $\xi_j$ and $\rho_j$, where $\xi_j$ are the $n_p$ solutions to $$r(\xi)r^*(\xi^*)+1=0$$

in the upper half complex $\xi$-plane where $*$ denotes the complex conjugate. For each $\xi_j$, and for $j=1, \ldots n_p$, $$\rho_j = -iK \frac{\prod_{k=1}^{n_z} \xi_j - z_k}{\prod_{k=1}^{n_p} \xi_j - \rho_k^*}$$

$\xi_j$ are the associated bound states, and $\rho_j$ are: the plane-wave residues. It follows that, in this example, for a reflection coefficient with $n_p$ poles, there are $2n_p$ complex parameters, $\xi_j$ and $\rho_j$, needed to obtain the representation, $\omega(t)$, of the pulse.

The ideal magnetization response to an RF pulse when using prefocused pulses is a "top-hat" like function, $$r(\xi) = \begin{array}{l} i \text{ for } |\xi| < 1, \\ 0 \text{ for } |\xi| > 1, \end{array}$$

No loss of generality is incurred by having the excited slice from $-1<\xi<1$, since this can correspond to any slice width in $\omega_3$ space by appropriately choosing the constant T.

In our example, $r(\xi)$ is approximated by a continuous function. Two useful choices are the Butterworth function and the Chebyshev I filter. For example, $C_n$ is a Chebyshev I function of order n; n is an integer. As n increases the function $C_n$ approximates the ideal response. Further information on these filters is provided in Parks and Burros, "Digital Filter Design," Wiley, 1987.

An important feature of these functions, which makes them suitable response functions for prefocused pulses, is that $r(\xi)$ decays quite rapidly to zero as $\xi \to \pm\infty$, the decay order increasing with n. It can be shown that there is a relationship between this decay order, and the decay order of a semi-infinite pulse as it approaches t=0. Hence, by choosing a reflection coefficient with a sufficiently large decay order, a pulse can be designed that is negligible in amplitude over the interval $-\tau_0<t<0$, for a given $\tau_0$, where $\tau_0$ is the desired prefocused time of the pulse. For multi-slice in-vivo spectroscopic imaging, the Chebyshev I filter function is unusable. With the application of the method of this invention, however, the Chebyshev I filter function is particularly suitable. The corresponding pulses have relatively large $\tau_0$ times, and the pulses have reasonably low power requirements.

TABLE 1

| $\eta$ | $\epsilon$ | $A_0$ (rad/ms) | $\tau_0$ (ms) |
| --- | --- | --- | --- |
| 7 | 0.1 | 4.87 | 2.45 |
|  | 0.2 | 4.00 | 2.74 |
|  | 0.3 | 3.48 | 2.94 |
| 8 | 0.1 | 4.54 | 3.14 |
|  | 0.2 | 3.76 | 3.47 |
|  | 0.3 | 3.29 | 3.69 |
| 9 | 0.1 | 4.29 | 3.87 |
|  | 0.2 | 3.57 | 4.23 |
|  | 0.3 | 3.14 | 4.45 |
| 10 | 0.1 | 4.08 | 4.62 |
|  | 0.2 | 3.41 | 5.02 |
|  | 0.3 | 3.01 | 5.27 |

Table 1 shows the maximum amplitude, $A_0$, and the prefocused time, $\tau_0$, for a series of pulses obtained from the Chebyshev I filter function, with T=1 ms. The $\tau_0$ values were obtained by assuming that the pulse's amplitude is negligible if it is less than 0.01 rad/ms. Therefore, $\tau_0$ is the largest value such that $|\omega(t)|<0.01$ for $-\tau_0<t<0$.

Figure 3:
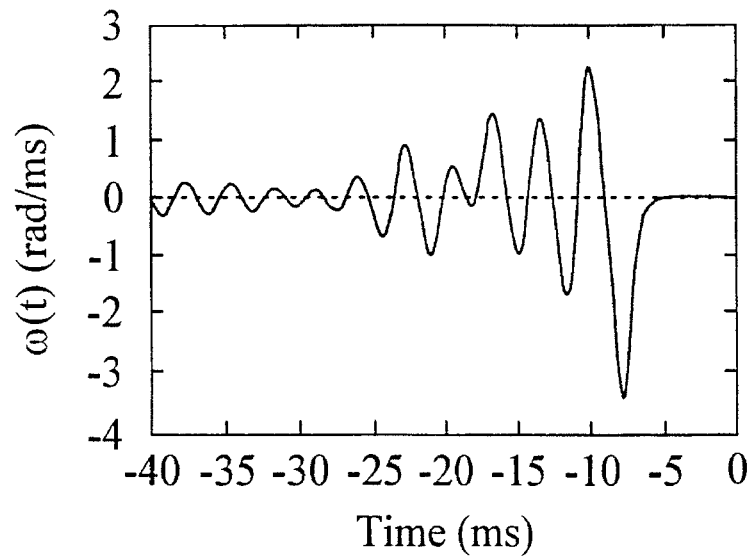
FIG. 3 shows an analytically designed prefocused RF pulse according to the method of this invention.

In a further and more specific example, an RF pulse 11 corresponding to $r(\xi)=i/(1+\epsilon^2 C_n^2(\xi))$ for T=1 ms, $\epsilon=0.2$, and n=10 is shown in FIG. 3. It shows, in agreement with Table 1, that for the last approximately 5 ms, the pulse has negligible amplitude. This is the prefocused time 12.

The RF pulse 11 forms the basis for a pulse to be used in spectroscopic imaging. For that application a pulse with a prefocused time of 1.25 ms, a total slice bandwidth exceeding 2.5 KHz (corresponding to a half-bandwidth of 9.4 rad/ms), and an amplitude not exceeding 13 rad/ms was needed. Ideally, the total pulse duration (excluding the prefocused time) would not exceed 5 ms.

Since the RF pulse 11 has a prefocused time 12 of 5.02 ms, it can be scaled by a factor 1.25/5.02≈0.25 along the time axis, with a corresponding scale in amplitude and of bandwidth of 5.02/1.25≈4. Hence the scaled pulse has a prefocused time of 1.25 ms, a maximum amplitude 13.69 rad/ms, and a half-slice-bandwidth of 8.03 rad/ms (corresponding to a total bandwidth of 2.6 KHz).

FIG. 3 shows that the RF pulse 11 in this application has a duration of approximately (40-5)×0.25=8.75 ms (excluding the prefocused time). Therefore, the RF pulse 11 as obtained with the analytic inversion has an excessive duration, and a slightly excessive amplitude. To correct these shortcomings numerical optimization is necessary.

Numerical Stage

Given an analytically designed RF pulse with a related magnetization response, it is often necessary to reduce its duration and maximum amplitude. Other characteristics of the RF pulse may also be varied, such as the sensitivity of the magnetization response to the amplitude of the RF pulse.

One method of reducing the RF pulse duration is truncating the RF pulse. When an RF pulse has non-negligible amplitude over the interval $-T_0<t<-\tau_0$, where $\tau_0$ is the RF pulse's prefocused time, it may be truncated, for example, by discarding an initial part of the pulse, so that the pulse is only non-negligible over the interval $-T'_0<t<-\tau_0$, where $T'_0-\tau_0$ is the desired duration of the RF pulse, excluding the prefocused time.

As a further example, given a representation of a truncated RF pulse, $\omega'(t)$, a cost, $c[\omega']$, is assigned to the truncated RF pulse and typically measures how closely the magnetization response to the truncated RF pulse matches the desired magnetization response, and whether the truncated RF pulse falls within predetermined parameters, such as maximum acceptable amplitude. Other factors, such as the sensitivity of the magnetization response to the amplitude of the truncated RF pulse may also be incorporated.

Given that the reflection coefficient used in the analytic stage has $n_p$ poles, there are $2n_p$ complex parameters, the solution lattice data, which identify the RF pulse; these are varied by a numerical optimization routine in order to find an RF pulse that minimizes the cost function, in the form of at least one parameter and at least one corresponding weighting. The cost function, upon evaluation, results in a single value which is used as an indicator of the quality of the RF pulse or how closely the RF pulse meets predetermined requirements. Examples of cost function parameters are total pulse energy, maximum pulse amplitude, pulse duration, duration of pulse amplitudes in excess of a predetermined value. The Chebyshev filter equation is well understood in the art of filter design. The equation $r(\xi)=i/(1+\epsilon^2 C_n^2(\xi))$ is described in many texts including that noted above. i is an integer and is usually 1 in the context of text book examples. $\xi=\Omega/\Omega_c$ where $\Omega_c$ is specified by the desired cutoff frequency. The function $C_n^2(\xi)=(\cos(n \cos^{-1}\xi))^2$ or $C_n(\xi)=(\cos(n \cos^{-1}\xi))$. $\epsilon$ is specified by the allowable passband ripple. Reference to any of a number of texts (including that set out above) allows for informed use of the Chebyshev filter equation. Many other parameters may be used based on predetermined requirements and the optimization routine selected. Routines such as the temperature-dependent simplex algorithm described in Press et al., Numerical Recipes in C, Second Edition, Cambridge University Press, 1992, Sec. 10.9, have been found to be suitable optimization routines.

In the further example, for each reflection coefficient, the truncated RF pulse is calculated only over the interval $-T'_0<t<-\tau_0$, the RF pulse being made to equal zero elsewhere. The cost function is then evaluated and soliton-lattice data varied following a predetermined pseudo random method. Usually the method accepts improvements and ignores iterations which are not improvements; however, the soliton-lattice data once varied may be accepted by the method even if no improvement exists. This enables the method to evaluate results based on several different solitoh-lattice data and select the 'best' results. In this way it is possible to improve the overall result by providing several starting points for further optimization.

Symmetry constraints can be used to reduce the number of parameters that need be varied. The ideal prefocused RF pulse has, at the end of the prefocused time, a magnetization response described by a reflection coefficient with the symmetry $$r(\xi)=-r^*(-\xi^*).$$

This results in the further constraints that, for j and j' not necessarily distinct, $$\xi_j=-\xi^*_{j'},$$

$$\rho_j=\rho^*_{j'}.$$

In the design of prefocused RF pulses, it has been found that performing the optimization only on the imaginary parts of the $\xi_j$ is often successful. When successful the $\rho_j$ need not be optimized. This may speed up optimization significantly.

EXAMPLE

Figure 4:
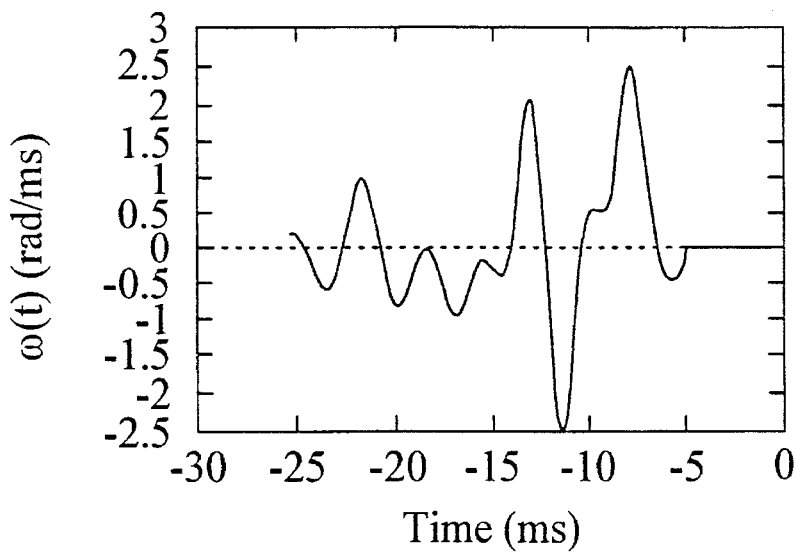
FIG. 4 shows the analytically designed prefocused RF pulse of FIG. 3 after subsequent numerical optimization according to the method of this invention.

The RF pulse 11 was numerically optimized and the resulting numerically optimized RF pulse 21 is shown in FIG. 4. The cost function used in the optimization took into account the maximum amplitude of the pulse, the magnetization response of the pulse, and the sensitivity of the response to the amplitude of the pulse. Only the imaginary parts of the $\xi_j$ were allowed to vary during the optimization. Further, the symmetry of $r(\xi)$ was used, and hence only half the imaginary parts of the $\xi_j$ needed to be varied-as follows from further constraints and the fact that none of the $\xi_j$ lie on the imaginary axis.

The numerically optimized RF pulse 21 is consistent with the above constraints for use in spectroscopic imaging. After scaling the time-axis by 0.25, the numerically optimized RF pulse 21 has a duration of 5.05 ms, excluding the prefocused time 22 of 1.25 ms, The maximum amplitude of the numerically optimized RF pulse 21 is 10.04 rad/ms, and the bandwidth is approximately 2.6 KHz.

Figure 5:
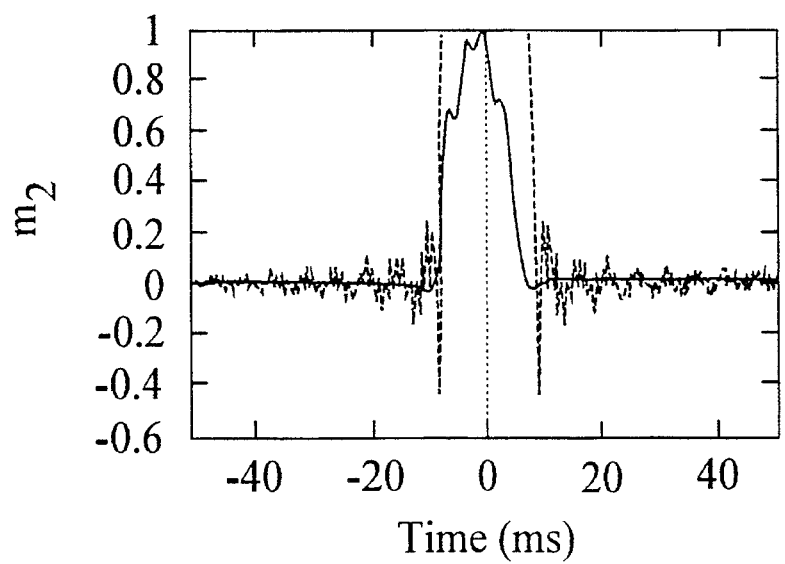
FIG. 5 shows the theoretical and experimental $m_2$ responses to the analytically designed prefocused RF pulse after subsequent numerical optimization according to the method of this invention.

FIG. 5 shows, with the dashed line, the theoretical magnetization profile ($m_z$) of the numerically optimized RF pulse 21, at the end of the 1.25 ms prefocused time 22. The numerically optimized RF pulse 21 was tried experimentally on a water phantom using a Bruker MSLX spectrometer equipped with a 3 T/1 m bore magnet (Magnex). The solid line in FIG. 5 shows the experimentally obtained profile.

This numerically optimized RF pulse 21 was used to acquire multi-slice phosphorus spectroscopic data. A multiplane phantom consisting of 30 mM saline solutions of phenyl phosphonic acid (PPA), sodium phosphate (Pi), and creatine phosphate (PCr), and 15 mM adenosine tdphosphate (ATP) was used. The amount of saline in the phantom was adjusted to provide similar coil loading to that obtained with a human head. An NMR signal was acquired with a quadrature birdcage head coil of 25 cm inner diameter, tuned to 51.7 MHz. Three slices, 3 cm thick, were selected in a transverse plane, and in-plane localization was achieved by means of two triangular phase encoding gradient pulses, with a rise time of 500 μs. Sixty four (8×8) phase encoding steps were used for each slice with a FOV of 24 cm. The repetition time was 1.5 s and 16 averages per phase encoding step resulted in a total acquisition time of 26 min.

Figure 6:
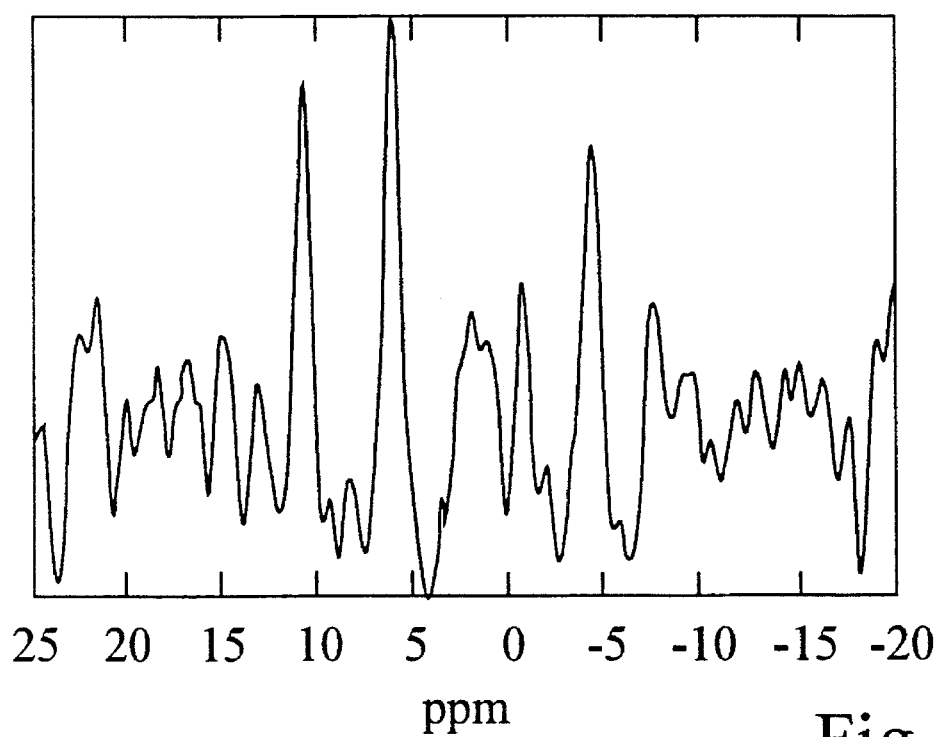
FIG. 6 shows a localized spectrum of a sample containing phosphorus compounds, obtained from multi-slice spectroscopic data using a 5.05 ms prefocused pulse provided according to the method of this invention.
Figure 7:
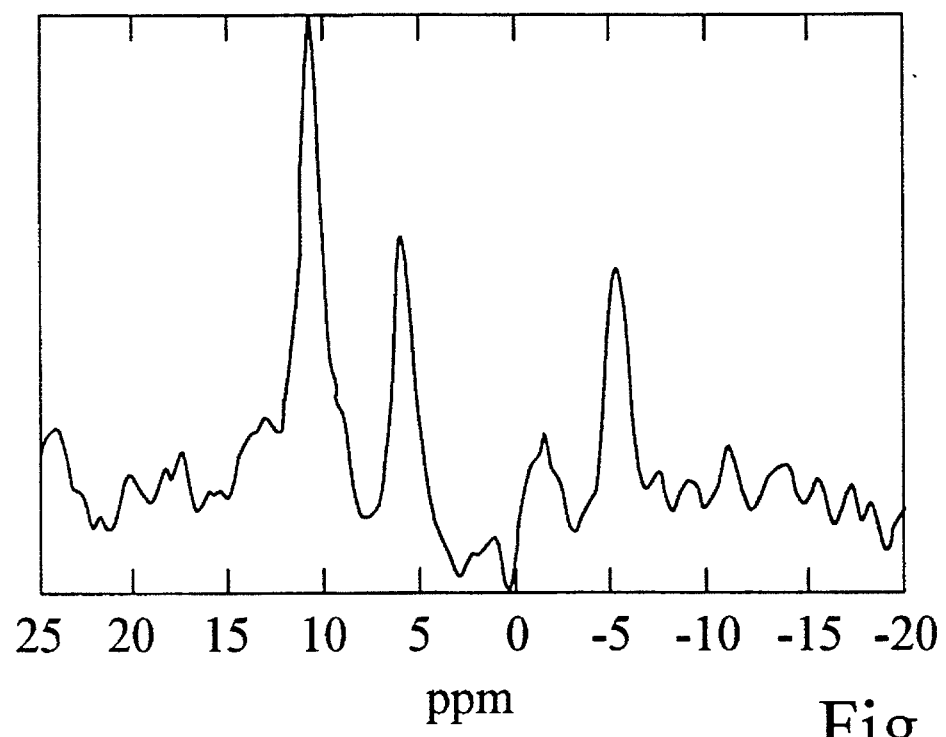
FIG. 7 shows a localized spectrum of a sample containing phosphorus compounds, obtained from multi-slice spectroscopic data using a 3.5 ms pulse as known in the art.

FIG. 6 presents an ATP spectrum extracted from the multi-slice spectroscopic data acquired with a prefocused pulse, and FIG. 7 presents an ATP spectrum extracted from the multi-slice spectroscopic data acquired with a 3.5 ms sine pulse. Only zero order phase correction was used to phase the spectrum acquired with the prefocused pulse. The frequency-dependent phase correction needed to phase the spectrum acquired with the sine pulse resulted in a rolling baseline and worse overall spectral quality.

In order to be used for MRI, ω(t), the representation of the RF pulse, must be converted into an RF pulse. This is accomplished through the use of a pulse generating means. The pulse generating means may accept a digital representation of a pulse or an analog representation of a pulse. The choice of pulse generating means is determined based on the format of the representation of the RF pulse.

When the representation of the RF pulse is in the form of digital complex values, a modulator in phase and quadrature may be used. Such a modulator requires an analog to digital converter for each of real and imaginary portions of the equation. The real and imaginary equations drives a cosine and a sine generator, respectively; outputs signals are then summed. In this fashion the amplitude and phase information is maintained in the generated RF pulse.

When the representation of the RF pulse is in the form of phase and amplitude, the pulse generating means may be in the form of an amplitude and phase modulator. Other suitable methods of converting the representation into an RF pulse exist, such as frequency and amplitude modulation.

Numerous other embodiments may be envisaged without departing from the spirit and scope of the invention.

What I claim is:

1. A method of providing an RF pulse for use in MRI comprising the steps of:
   (a) selecting a reflection coefficient related to a predetermined magnetization response;
   (b) iteratively altering the reflection coefficient and evaluating a corresponding magnetization response and RF pulse until the corresponding magnetization response and RF pulse are within predetermined parameters; and
   (c) providing a representation of an RF pulse based on the reflection coefficient.

2. The method of claim 1 wherein a predefined pseudo random method is used to preform the optimization.

3. The method of claim 2 wherein a predetermined cost function is used to evaluate results of each iteration.

4. The method of claim 1 wherein the reflection coefficient is selected from equations for bandpass filters.

5. The method of claim 4 wherein the reflection coefficient corresponds to a Chebyshev I filter response.

6. The method of claim 4 wherein the reflection coefficient corresponds a Butterworth filter response.

7. The method of claim 1 further comprising the step of providing the representation of the RF pulse to a pulse generating means.

8. A method of providing an RF pulse for use in MRI comprising the steps of:
   (a) selecting a reflection coefficient related to a predetermined magnetization response;
   (b) iteratively performing the following steps:
      (i) providing a representation of an RF pulse based on the reflection coefficient;
      (ii) determining the magnetization response of the representation;
      (iii) when the magnetization response and the RF pulse are not within predetermined parameters optimizing the reflection coefficient and returning to step (b)
   until the magnetization response and the RF pulse are within predetermined parameters; and
   (c) providing a final representation of an RF pulse based on the reflection coefficient.

9. The method of claim 8 wherein the soliton lattice algorithm is used to provide the representation of the RF pulse.

10. The method of claim 8 wherein a predefined pseudo random method is used to perform the optimization.

11. The method of claim 8 wherein a predetermined cost function is used to evaluate results of each iteration.

12. The method of claim 8 wherein the reflection coefficient corresponds to a bandpass filter response.

13. The method of claim 12 wherein the reflection coefficient corresponds to a Chebyshev I filter response.

14. The method of claim 12 wherein the reflection coefficient corresponds to a Butterworth filter response.

15. The method of claim 8 further comprising the step of providing the representation of the RF pulse to a pulse generating means.

16. A method of providing an RF pulse for use in MRI comprising the steps of:
 (a) selecting a reflection coefficient related to $C_n$, a Chebyshev I filter response of order n, by the equation $r(\xi)=i/(1+\epsilon^2 C_n^2(\xi))$ wherein i is an integer, $C_n^2(\xi)=(\cos(n\cos^{-1}\xi))^2$, $\xi=\Omega/\Omega_c$, $\Omega_c$ is specified by the desired cutoff frequency, and $\epsilon$ is specified by the allowable passband ripple;
 (b) using a soliton lattice algorithm and the reflection coefficient to provide a representation of an RF pulse;
 (c) determining the magnetization response of the representation;
 (d) when the magnetization response and the RF pulse are not within predetermined parameters optimizing the reflection coefficient based on a predetermined cost function and returning to step (b); and
 (e) providing a final representation of an RF pulse based on the reflection coefficient.

17. The method of claim 16 wherein n=10, and $\epsilon=0.2$.

18. The method of claim 16 further comprising the step of providing the representation of the RF pulse to a pulse generating means.

* * * * *